(12) United States Patent
Lee et al.

(10) Patent No.: US 7,170,224 B2
(45) Date of Patent: Jan. 30, 2007

(54) ELECTRODE FOR ORGANIC LIGHT EMITTING DEVICE AND ORGANIC LIGHT EMITTING DEVICE COMPRISING THE SAME

(75) Inventors: Jae Seung Lee, Daejeon (KR); Se Hwan Son, Daejeon (KR); Young Chul Lee, Daejeon (KR); Jeoung Kwen Noh, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 10/971,318

(22) Filed: Oct. 22, 2004

(65) Prior Publication Data

US 2005/0162071 A1    Jul. 28, 2005

(30) Foreign Application Priority Data

Oct. 23, 2003   (KR) .............. 10-2003-0074361

(51) Int. Cl.
  *H01J 1/88*   (2006.01)
  *H01J 1/70*   (2006.01)
  *H01J 1/62*   (2006.01)
(52) U.S. Cl. .............. 313/503; 313/504; 313/506
(58) Field of Classification Search ........... 313/506
  See application file for complete search history.

(56) References Cited

U.S. PATENT DOCUMENTS 5,962,970 A * 10/1999 Yokoi et al. ........... 313/506

6,392,339 B1 * 5/2002 Aziz et al. ........... 313/504

FOREIGN PATENT DOCUMENTS

| JP | 10-162961 | 6/1998 |
|---|---|---|
| JP | 10-214683 | 8/1998 |
| JP | 11-339970 | 12/1999 |
| JP | 2000-231985 | 8/2000 |
| JP | 2000-277252 | 10/2000 |
| JP | 2002-318553 | 10/2002 |
| KR | 2001-0090848 | 10/2001 |

\* cited by examiner

*Primary Examiner*—Mariceli Santiago
*Assistant Examiner*—Elizabeth Rielley
(74) *Attorney, Agent, or Firm*—Cantor Colburn LLP

(57) ABSTRACT

The present invention provides a light-transmitting electrode in which metal lines made of a metal with the same or superior electric conductivity to a material for the electrode are arranged linearly on the upper surface, lower surface or both surface of the electrode in the direction away from the connection part between the electrode and an electrode pad. Also, the present invention provides an electrode with a structure in which different electrically conductive compounds are alternately layered. The electrode of the present invention is excellent in transparency and electric conductivity. Also, the present invention provides organic light-emitting devices comprising the electrode.

14 Claims, 5 Drawing Sheets

ELECTRODE FOR ORGANIC LIGHT EMITTING DEVICE AND ORGANIC LIGHT EMITTING DEVICE COMPRISING THE SAME

TECHNICAL FIELD

The present invention relates to an electrode for organic light-emitting devices and to an organic light-emitting devices comprising the same. More particularly, the present invention relates to an electrode for organic light-emitting devices, which has improved electric conductivity, and to an organic light-emitting devices comprising the same.

BACKGROUND ART

An organic light-emitting device comprises two opposite electrodes and a plurality of semiconducting organic thin layers between the electrodes. The organic light-emitting device with this structure operates on the principle of the conversion of electric energy into light in the organic materials, known as organic electroluminescence. Specifically, in the structure in which organic layers are sandwiched between positive and negative electrodes, when voltage is applied between the two electrodes, holes from the positive electrode and electrons from the negative electrode are injected into the organic layers. When the injected holes and electrons meet each other, excitons are formed, and when these excitons decay to the ground state, light is emitted.

In the organic light-emitting devices as described above, light generated in the organic layers is emitted through a light-transmitting electrode, and thus organic light-emitting devices can be classified into top emission type, top emission type and dual emission type. In case of the top or bottom emission type device, one of the two electrodes should be a light-transmitting electrode and in the dual emission type device, both the two electrodes should be light-transmitting electrodes.

Following the publication by Kodak Company that the use of organic layers with multilayer structure allows the devices to be driven at low voltage, many studies have been conducted on the organic light-emitting devices. Recently, color display devices using the organic light-emitting device are commonly applied to the portable telephones.

In addition, recent organic light-emitting devices show rapid improvement of efficiency according as the studies on the use of phosphorescent materials as a substitute for the conventional fluorescent materials are performed. Also, there is an expectation that the organic light-emitting devices will substitute for the conventional illumination devices in the near future.

In order that the organic light-emitting devices are used for illumination, the devices should be driven at higher brightness than that of the conventional color display devices, and also must be capable of maintaining a high brightness like the conventional illumination devices. In order to improve the brightness of the organic light-emitting device sufficiently, light emission should be made at large area, and for this purpose, high driving current should be applied. In addition, in order to maintain constant brightness at large area, high current as described above should be uniformly supplied into the large-area devices.

DETAILED DESCRIPTION OF THE INVENTION

Technical Subject

Figure 1:
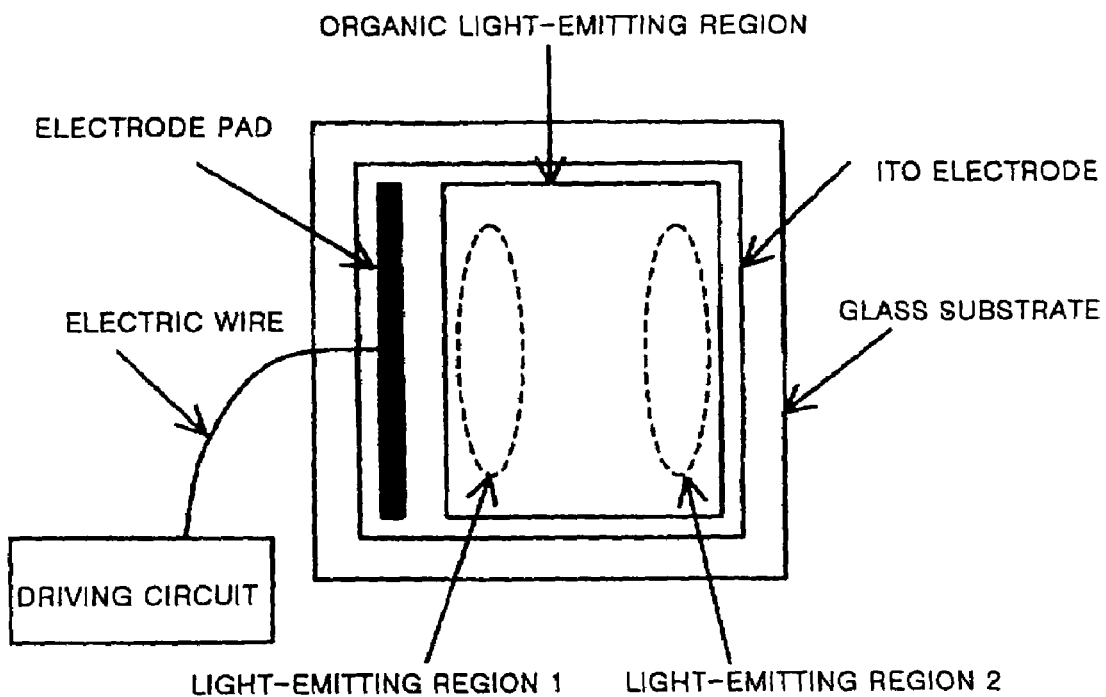
FIG. 1 illustrates a top view of a general large-area organic light-emitting device.
Figure 2:
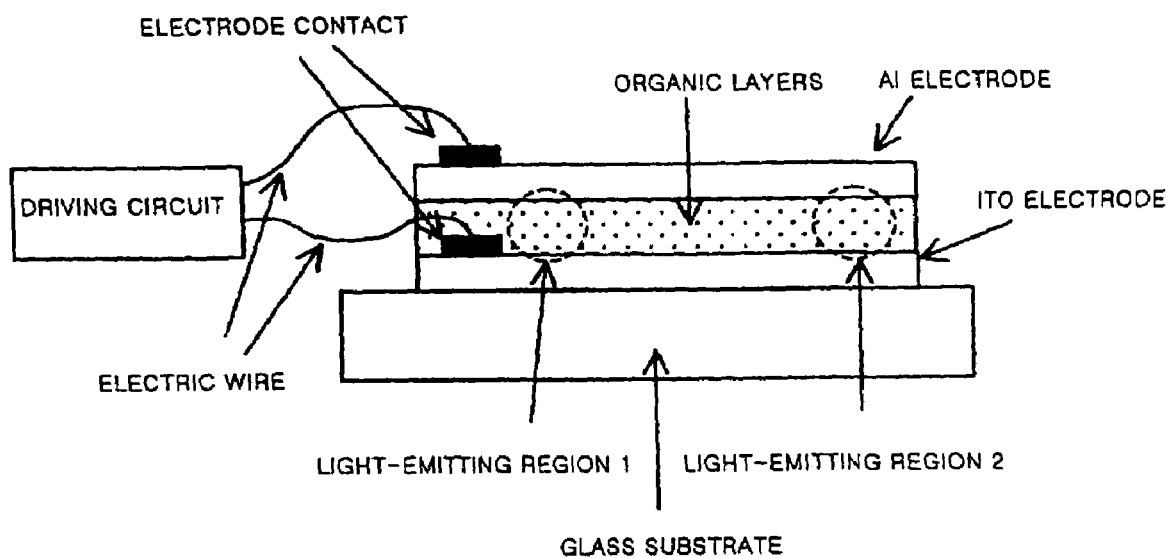
FIG. 2 illustrates a cross-sectional view of a general large-area organic light-emitting device.

As a positive electrode material for the organic light-emitting devices, metal oxides with high work function are mainly used. However, such metal oxides have relatively low electric conductivity. Thus, if such metal oxides are used in organic light-emitting devices or LCDs with small display area, there will be no problems. However, if they are used for electrodes with large area or long length in large-area organic light-emitting devices such as illumination devices, the light emission of the devices will not be uniform throughout the light-emitting surface, because the voltage drop increases according as the distance from a power source become larger, so that electric currents are not uniformly supplied into a light-emitting surface. For example, as shown in FIGS. 1 and 2, the devices will emit light only near a part where electrodes are electrically connected with a driving circuit (light-emitting region 1), and they will emit weak light or no light at the remaining part (light-emitting region 2).

Meanwhile, a negative electrode material for the organic light-emitting devices, metals with low work function or their alloys are mainly used. Such metals are highly conductive materials, but if they are formed into thin films to be applied for the electrodes of the organic light-emitting devices that require transparent electrodes, they will show a reduction in electric conductivity. Thus, also in this case, electric currents are not uniformly supplied into the light-emitting surface, so that the light emission of devices would not be uniform throughout the light-emitting surface. For this reason, in order to form light-transmitting electrodes applicable to various organic light-emitting devices, it is necessary to reduce the resistance of electrodes such that high-brightness light emission occurs in large-area devices uniformly.

Moreover, a reduction in the resistance of electrodes is useful in the preparation of not only large-area organic light-emitting devices but also passive matrix display devices. The passive matrix display devices have very low production costs because they do not require a back plate with an amorphous or poly-silicon transistor as required in active matrix displays. However, one of important problems in the passive matrix organic light-emitting displays is that it is necessary to prepare electrodes with excellent light transmission and electric conductivity. However, an ITO electrode, a light-transmitting electrode that is currently mainly used, has high resistance. For this reason, if the electrode size increases due to an increase of the display size, the voltage drop of the electrodes will be serious according as much, thus realization of display images is also difficult.

Accordingly, in the field of the organic light-emitting devices, there is a need for the development of the technology to reduce the resistance of light-transmitting electrodes.

DISCLOSURE OF THE INVENTION

The present inventors have found that a light-transmitting electrode for organic light-emitting devices, which has reduced resistance while maintaining its transparency, can be prepared by either placing metal lines made of a metal with the same or superior electric conductivity to a material for the electrode on the upper surface, lower surface or both surfaces of the electrode, or alternately stacking electrically conductive metal compounds and/or conventional electrode materials to form electrode, and thus accomplished the present invention.

The present invention provides a light-transmitting electrode in which metal lines made of a metal with the same or superior electric conductivity to the electrode are arranged linearly on the upper surface, lower surface or both surfaces of the electrode in the direction away from the connection part between the electrode and an electrode pad. As used herein, the term "electrode pad" refers to a conductor formed on the electrode in order to connect the electrode with a power source. In some cases, the electrode pad is also recognized as a part of the electrode structure. Furthermore, the metal lines made of the metal with the same or superior electric conductivity to the electrode are arranged linearly in the direction away from the connection part of the electrode and the electrode pad.

The electrode pad and the metal lines may be formed of the same or different materials. Furthermore, the electrode pad and the metal lines may be formed integrally together or separately by forming the electrode pad and then the metal lines. If the electrode pad and the metal lines are formed in an integral structure with the same material, operations for forming the electrode pad and the metal lines become simple, resulting in an increase in operation efficiency.

Also, the present invention provides a light-transmitting electrode with a structure in which metals or metal compounds with different electric conductivities are alternately deposited.

In addition, the present invention provides an organic light-emitting device comprising the above-described electrode.

Hereinafter, the present invention will be described in more detail.

In one embodiment of the present invention, the present invention provides an electrode in which metal lines made of a metal with the same or superior electric conductivity to a material for the electrode are arranged linearly on the upper surface, lower surface or both surfaces of the electrode in the direction away from the connection part between the electrode and the electrode pad.

Figure 3A:
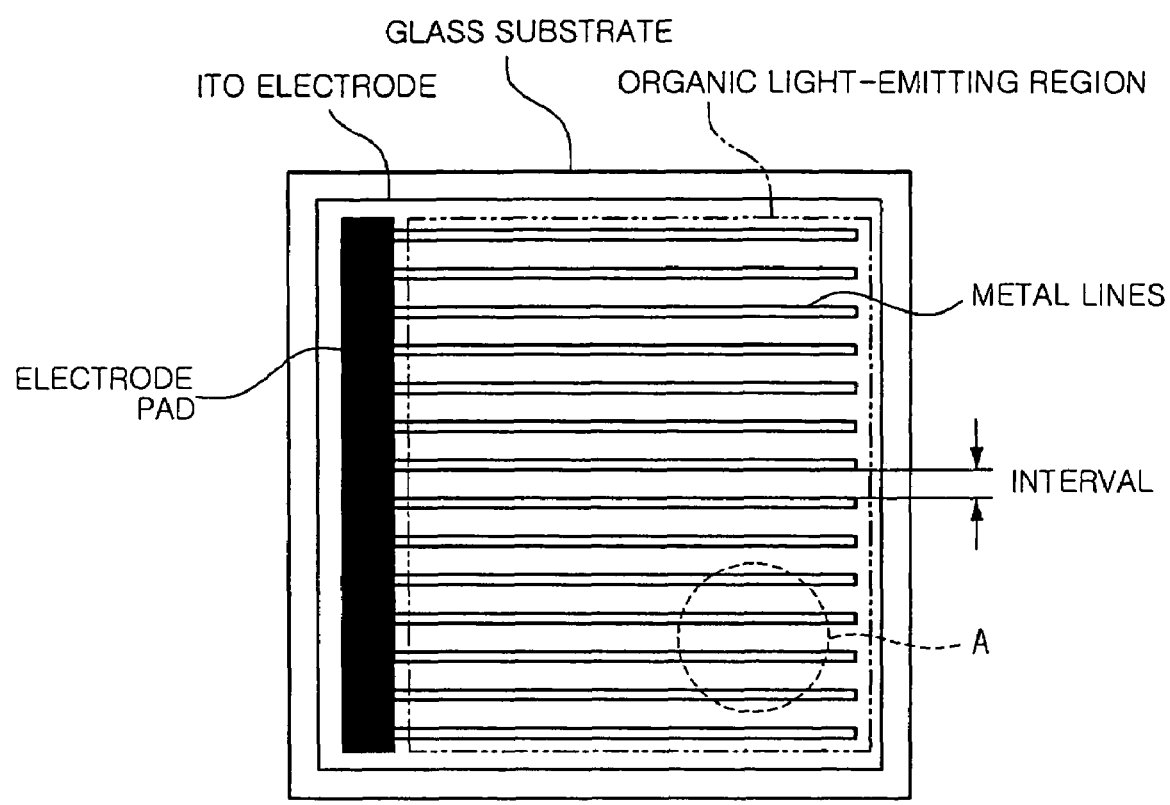
FIG. 3 is a top view (FIG. 3A), exploded view (FIG. 3B), and cross-sectional view (FIG. 3C) of an organic light-emitting device electrode prepared according to one embodiment of the present invention.
Figure 3B:
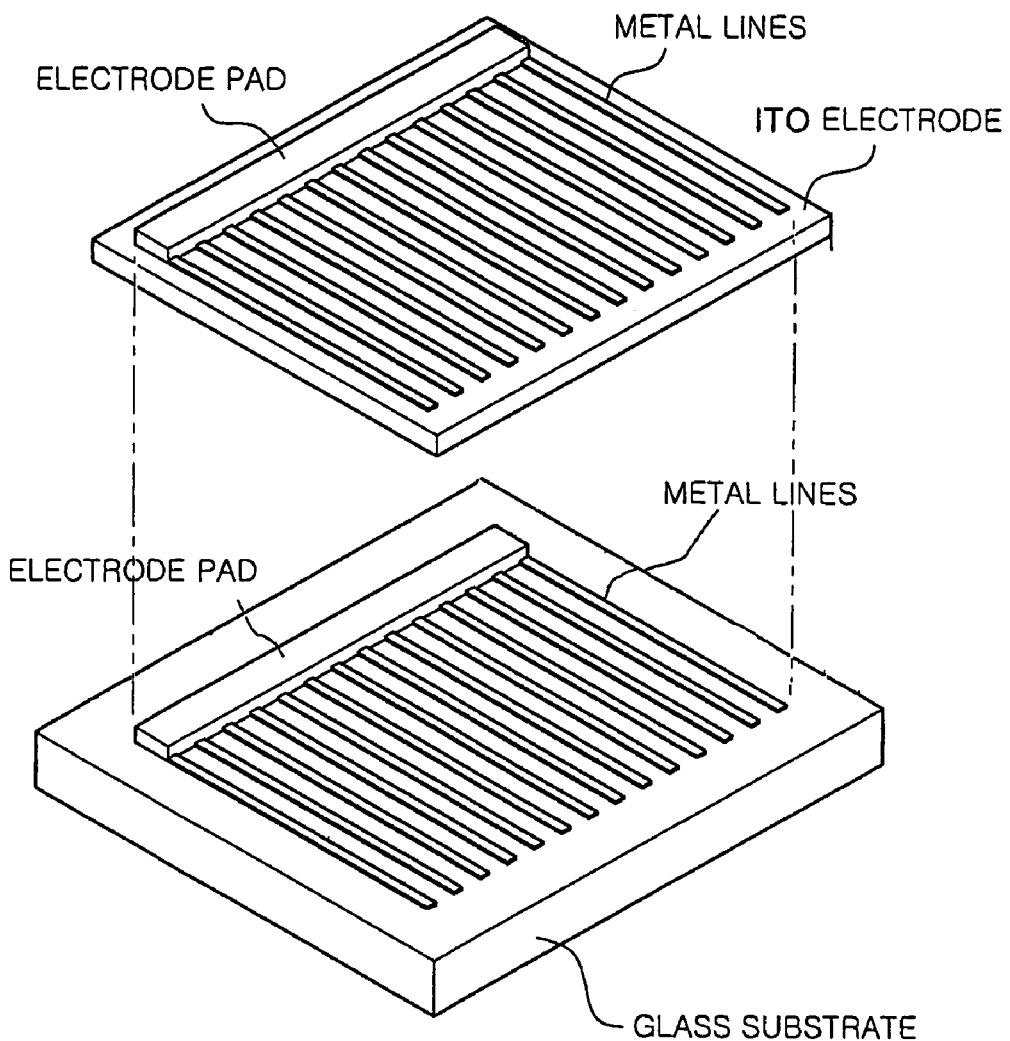
Figure 3C:
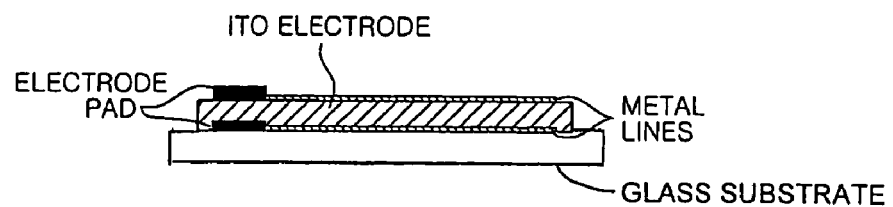

For example, if the electrode pad is placed on one side of a surface of the electrode as shown in FIG. 3, the metal lines can be arranged linearly on the upper surface (FIG. 3A), lower surface (not shown) or both surfaces (FIGS. 3B and 3C) of the electrode in the direction perpendicular to the electrode pad. In this case, the width of the arranged metal lines is preferably about 50–1,000 µm, and the interval between the arranged metal lines is preferably about 200–10,000 µm. An increase in the width of the metal lines will show an improvement in electric conductivity, but may have an adverse effect on light transmission. For this reason, the width of the metal lines is preferably maintained in the range as described above, Similarly, a reduction in the interval between the arranged metal lines will show an improvement in electric conductivity, but have an adverse effect on light transmission. For this reason, the interval between the arranged metal lines is preferably maintained in the above-described range.

Meanwhile, the thickness of the metal lines may vary according to the applications and required electric conductivity, and a person skilled in the art can adjust the thickness appropriately. Preferably, the thickness of the metal lines is about 0.1–5 µm. This is because if the metal lines are too thin, the electric conductivity will not be improved. In addition, if the lines are too thick, the deposition of the metal lines will take a long time and the electric difference in the electrode will be serious, thus inducing interlayer short between positive and negative electrodes.

Examples of the metal (metal line material) with the same or superior electric conductivity to the electrode material, which can be used in the embodiment of the present invention, include, but are not limited thereto, aluminum, silver, gold, copper, palladium, nickel, chromium, titanium, molybdenum, platinum and an alloy thereof.

The electrode pad may be made of a metal, such as aluminum, silver, gold, copper, palladium, nickel, chromium, titanium, molybdenum, platinum, or an alloy thereof, or other conductive material. The material of the electrode pad may be the same or different from the above-described metal with the same or superior electric conductivity to the electrode material.

In this embodiment, examples of a method for arranging the metal lines with the same or superior electric conductivity to the electrode material on the electrode include, but are not limited thereto, a vapor deposition method using a shadow mask.

Figure 4:
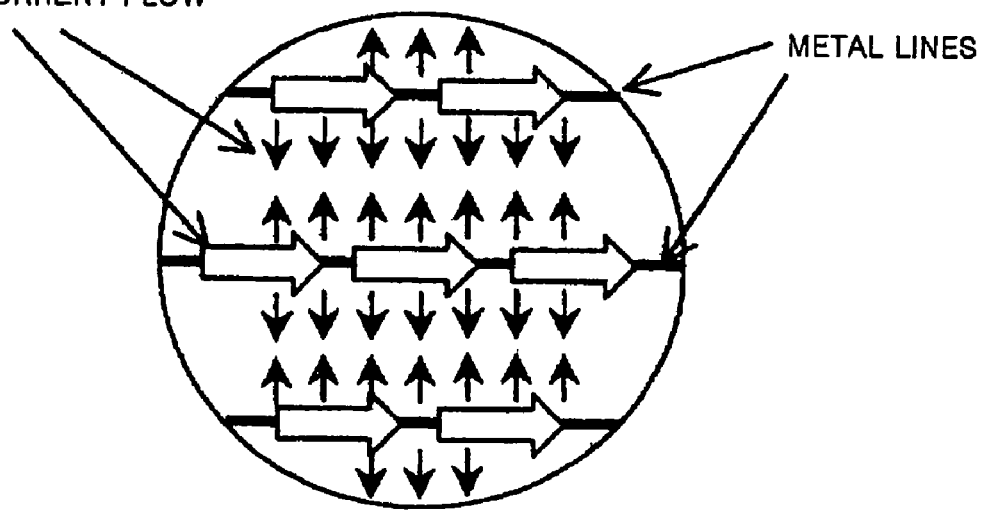
FIG. 4 shows the flow of electric currents in region A in FIG. 3.

As described above, if the metal lines are placed on the upper surface, lower surface or both surfaces of the electrode at a suitable interval in the direction away from the connection part between the electrode and the electrode pad, electric currents can flow as shown in FIG. 4. In detail, most of electric currents supplied through the electrode pad will flow through the linearly arranged metal lines in the direction away from the electrode pad, and at the electrode region between the metal lines, electric currents will flow in a direction almost perpendicular to the metal lines. In this way, electric currents can be uniformly supplied up to a region far away from the connection part between the electrode and the electrode pad, thereby minimizing the voltage drop within the electrode.

In organic light-emitting devices, the metal lines are preferably placed between the electrode and the organic layers. Specifically, since the metal lines are used to reduce electrical resistance, their thickness is preferably more than 0.1 µm, however at this thickness most of metals will not transmit visible light. Accordingly, even though light is generated in an organic light-emitting layer, the light generated where the metal lines are positioned is not emitted to the outside, and thus there is no need to generate light in the regions of the organic light-emitting layer above or below the metal lines. Therefore, if the metal lines are placed at the side of organic layers and a material that does not form an ohmic contact with the organic layers is selected for the metal lines, the metal line can supply electric currents only to the areas of the electrode where visible light can be transmitted and cannot supply electric currents to the organic layer, thus increasing the electrical efficiency of the device. Accordingly, the metal lines are preferably placed between the electrode and the organic layers in view of electric efficiency.

In another embodiment, the present invention provides an electrode which does not consist of only a single layer but has a structure in which metal layers and electrically conductive metal oxides are alternately stacked on each other.

If the electrode, made of metal compound including metals and metal oxides, is prepared in a film thinner than a certain thickness, it has favorable light transmission but a very low electric conductivity. On the other hand, when the electrode thickness increases so as to improve the electric conductivity, the light transmission exponentially reduces due to the absorption of visible light by the electrode material.

However, if the electrode made of metal or metal oxide is formed into a multilayer structure with other metal or metal oxide, the multilayer structure electrode will show different properties from the case of the single layer electrode. That is, even if the thickness of the multilayer structure is the same as that of the non-transparent single layer structure, the multilayer structure can be transparent. This is because if the electrode is formed into the multilayer structure, light reflected from each layer will disappear by an effect of interference, with increasing the light transmission.

Using such a characteristic, the present inventors have formed an electrode with a multilayer structure, such as a two-layer to nine-layer structure, by depositing different electrically conductive metal compounds, such as metals or metal oxides, into layers.

The electrode thus prepared has a larger thickness than the conventional electrode prepared to a thin film for the transparency, but can provide transparency by the above-described principle. Moreover, as the electrode material is formed into the multilayer structure, the total thickness of the electrode material is increased so that the electric conductivity of the electrode can be increased. Also, the electric conductivity of the electrode can be increased by the use of the electrically conductive compounds.

Examples of the electrically conductive metal compounds which can be used in this embodiment include, but not limited thereto, metals, such as aluminum, silver, gold, copper, indium, tin, zinc, palladium, nickel, chromium, titanium, molybdenum and platinum, and metal oxides thereof.

For the formation of the multilayer structure, any deposition method known in the prior art, such as plasma sputtering, may be used. In the use of the above method, some differences in refractive indexes of the electrode materials including metal compound are observed due to various variables, such as vacuum degree in deposition, the temperature of a substrate, plasma power, and the composition of the electrode material. Thus, the optimal thickness of each layer can easily be modified considering the changes of the refractive indexes.

Figure 5:
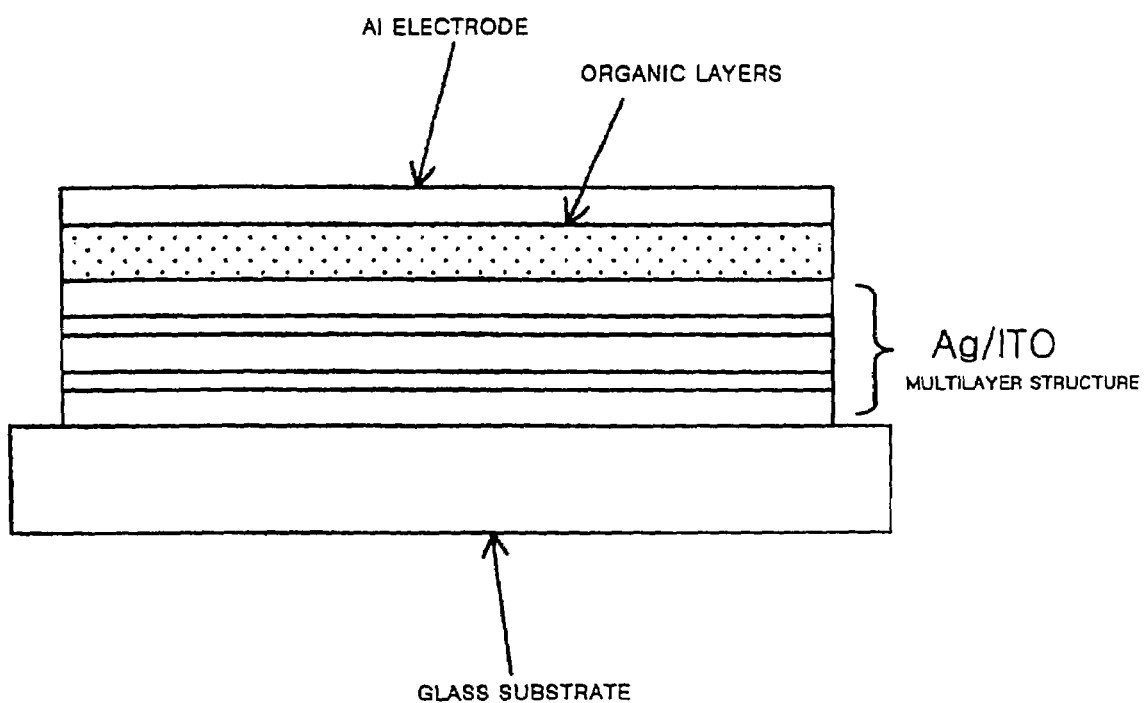
FIG. 5 is a cross-sectional view of an organic light-emitting device prepared according to another embodiment of the present invention.
Figure 6:
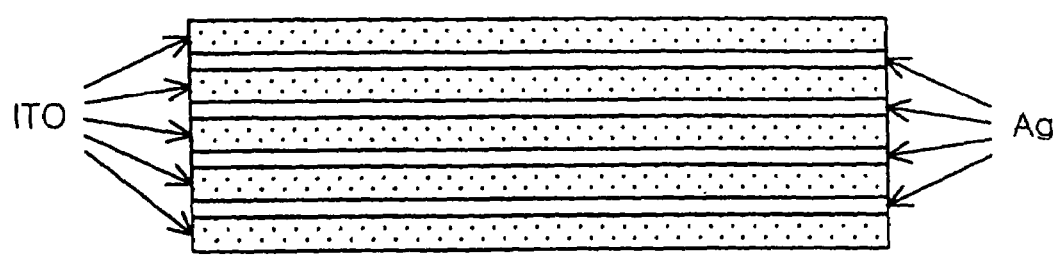
FIG. 6 is an enlarged view of a positive electrode structure in the organic light-emitting device shown in FIG. 5.

The electrode prepared according to the above-described embodiment may be a positive or negative electrode. A layer of one electrode material preferably has a thickness of 300–1,200 Å, and a layer of another electrode material preferably has a thickness of 50–150 Å. The relatively thick layer in the electrode is preferably made of electrically conductive metal oxides, such as indium thin oxides, indium zinc oxides, and ruthenium oxides, which have a higher light transmission to that of general metals. The relatively thin film is preferably made of a single metal, such as silver, gold, copper or aluminum, or an alloy of such metals. FIG. 5 illustrates the structure of an organic light-emitting device including a positive electrode with the above-described multilayer structure, and FIG. 6 illustrates an electrode with a nine-layer structure.

For example, if an electrode with a nine-layer structure is prepared on a glass substrate using indium thin oxide (ITO) and a metal of Ag as the electrode materials, it show excellent electric properties, that is a light transmission including the glass substrate is more than 60% at a visible light region of 5,500 Å, and a surface resistance is about 1.5 $\Omega/\square$.

Examples of the material of the light-transmitting electrode with the multilayer structure, which can be used in the present invention, includes, but are not limited thereto, metals, such as vanadium, chromium, copper, zinc, gold, silver and alloys thereof; metal oxides, such as zinc oxide, indium oxide, tin oxide, indium tin oxide, indium zinc oxide (IZO), fluorine-doped tin oxide, and ruthenium oxide; a combination of metal and oxide, such as $ZnO:Al$ or $SnO_2:Sb$; and electrically conductive polymers, such as poly(3-methylthiophene), poly[3,4-(ethylene-1,2-dioxy) thiophene] (PEDT), polypyrrole, and polyaniline.

The present invention provides an organic light-emitting device comprising an electrode in which metal lines made of a metal with the same or superior electric conductivity to the electrode are arranged linearly on the upper surface, lower surface or both surfaces of the electrode in the direction away from the connection part between the electrode and the electrode pad.

In addition, the present invention provides an organic light-emitting device comprising a light-transmitting electrode with a structure in which different electrically conductive metal compounds are layered.

Generally, the organic light-emitting device comprises a structure in which a first electrode, organic layers including an organic light-emitting layer, and a second electrode, are sequentially stacked. The electrodes and organic layers of the organic light-emitting device according to the present invention may be formed in a single layer or multilayer structure, and may have materials and structures, which are known in this technical field.

Profitable Effect

The electrode according to the present invention has not only excellent transparency but also excellent electric conductivity due to low resistance, so that it can provide an effective light-emitting property when it is applied to the organic light-emitting devices. In particular, when the electrode of the present invention is applied in the formation of a large-area electrode for large-area organic light-emitting devices, it can uniformly supply high current into large area so that the device can uniformly emit high-brightness light. Accordingly, the use of the electrode of the present invention is very effective in the preparation of the large-area organic light-emitting devices which can used in illumination devices.

In addition, the electrode of the present invention is excellent in transparency and electric conductivity, and thus, will also be useful in the preparation of passive matrix organic light-emitting display displays.

BEST MODE FOR CARRYING OUT THE INVENTION

Hereinafter, the present invention will be described in more detail by way of examples. It is to be understood, however, that these examples are not intended to limit the scope of the present invention.

EXAMPLES

Example 1

In this Example, electrically conductive metal lines were arranged linearly on an electrode, thus increasing the electric conductivity of the electrode.

For this purpose, on a glass substrate with a size of 100 mm×100 mm which had been subjected to an initial washing process, indium tin oxide (ITO) was deposited by sputtering in a thickness of 1,750 Å so as to form a positive electrode. After forming the positive electrode, aluminum was vacuum deposited in a thickness of 2,500 Å using a shadow mask having patterns of metal lines and an electrode pad as shown in FIG. 3, so as to form the metal lines and the electrode pad simultaneously. The width of the aluminum metal lines and the interval between the metal lines were set to 0.3 mm and 2.5 mm, respectively.

After forming the light-transmitting positive electrode as described above, organic layers were deposited in the order of CuPc as a hole-injection layer, NPB as a hole-transport layer, $Alq_3$ as a light-emitting layer and $Alq_3$ as an electron-transport layer, each having a thickness of 20–500 Å. Then, a LiF layer as an electron-injection layer was deposited in a thickness of 10 Å, and aluminum as a negative electrode was deposited in a thickness of 2,000 Å. Then, the resulting device was subjected to an encapsulation process in order to isolate the device from the atmosphere.

The average light transmission of the positive electrode in the above-prepared device was about 70% which is not greatly different from about 80% that is the light transmission of an electrode made of only indium tin oxide. Also, the average value of electric conductivity measured in a direction parallel to the aluminum metal lines was about 1.2 Ω/□, which is an excellent value. The above-prepared device emitted uniform light throughout the entire light-emitting region when the device was operated at voltage and current of 5 V and 1.1 A, respectively.

In the light transmission measurement, values were measured directly by using a system having a light source on one side of the electrode and a photodetector on the other side. The electric conductivity was measured with HP4155 for samples which had been separately prepared for the measurement of the electric conductivity.

In this Example, since the aluminum metal lines deposited on the positive electrode, which contact with the organic layers, cannot supply electric currents into the CuPc layer (a hole-injection layer), and thus light is not generated at the areas above the metal lines. Since the aluminum metal lines cannot transmit visible light, power loss, which might be caused by the light emission at the areas of the organic layer where the aluminum metal lines are positioned, can be prevented.

Example 2

An organic light-emitting device was prepared in the same manner as in Example 1 except that aluminum metal lines and an electrode pad were formed on a glass substrate in a thickness of 2,500 Å, on which an electrode was formed in a thickness of 1,750 Å using indium tin oxide (ITO), a positive electrode material, and then organic layers were formed.

The average light transmission of the positive electrode in the above-prepared device was about 70%. Also, the average value of electric conductivity measured in a direction parallel to the aluminum metal lines was an excellent value of about 1.2 Ω/□. The above prepared device emitted uniform light throughout the entire light-emitting region when the device was operated at voltage and current of 5 V and 1.1 A, respectively.

In this case, since the areas of indium tin oxide, where the aluminum metal lines are positioned and thus cannot transmit visible light, supply electric currents into the hole-injection layer, light is generated at the areas of the organic layer above the aluminum metal lines. However, the above-generated light is blocked by the aluminum metal lines and cannot be emitted to the outside, thus causing the loss of power.

Example 3

An organic light-emitting device was prepared in the same manner as in Example 1 except for the following. That is, aluminum metal lines and an electrode pad were formed on a glass substrate in a thickness of 1,250 Å, on which an electrode was formed in a thickness of 1,750 Å using indium tin oxide (ITO), a positive electrode material. Next, on the electrode surface at the positions corresponding to the above-formed aluminum metal lines and electrode pad, aluminum electrode lines and an electrode pad were additionally formed in a thickness of 1,250 Å, and then organic layers were formed.

The average light transmission of the positive electrode in the above-prepared device was about 70%. Also, the average value of electric conductivity measured in a direction parallel to the direction of the aluminum metal lines was an excellent value of about 1.2Ω/□. The above-prepared device emitted uniform light throughout the entire light-emitting region when the device was operated at voltage and current of 5 V and 1.1 A.

It is thought that, if the areas of indium tin oxide, where the aluminum metal lines are positioned and thus cannot transmit visible light, supply electric currents into the hole-injection layer, light may be generated at the areas of the organic layer above the aluminum metal lines. However, the above-generated light is blocked by the aluminum metal lines and cannot be emitted to the outside, causing loss of power.

Example 4

In this Example, a conventional electrode material and an electrically conductive metal were formed into a multilayer structure so as to increase the electric conductivity of an electrode.

For this purpose, on a glass substrate with a size of 100 mm×100 mm which had been subjected to an initial washing process, a positive electrode with a nine-layer structure was formed by sputtering. In this case, the nine-layer structure was formed by sequentially depositing ITO of 400 Å, Ag of 100 Å, ITO of 800 Å, Ag of 100 Å, ITO of 800 Å, Ag of 100 Å, ITO of 800 Å, Ag of 100 Å and ITO of 400 Å, on the glass substrate.

After forming the light-transmitting positive electrode as described above, organic layers were deposited in the order of CuPc as a hole-injection layer, NPB as a hole-transport layer, $Alq_3$ as a light-emitting layer and $Alq_3$ as an electron-transport layer, each having a thickness of 20–500 Å. Then, a LiF layer as an electron-injection layer was deposited in a thickness of 10 Å, and aluminum as a negative electrode was deposited in a thickness of 2,000 Å. Then, the resulting device was subjected to an encapsulation process in order to isolate the device from the atmosphere.

The positive electrode of the above-prepared device showed a light transmission of more than 60% at a visible light region of 5500 Å, and an excellent electric conductivity of about 1.5 Ω/□. In case of Ag, if the above 4 layers of Ag with a thickness of 100 Å for each layer were made to a single layer with a thickness of 400 Å, it can show some increase in electric conductivity but can transmit little or no visible light. However, in this Example, Ag was deposited in four layers with a thickness of 100 Å for each layer, and thus, excellent light transmission could be achieved.

A device comprising the nine-layer structure electrode prepared as described above showed almost uniform brightness throughout the entire light-emitting surface at a light-emitting area of about 60 cm$^2$. In this case, the operation voltage and current of the device were 5 V and 1.1 A, respectively.

Comparative Example 1

An organic light-emitting device was prepared in the same manner as in Example 1 except that the metal lines were not formed and the positive electrode was formed in a thickness of 1,750 Å using only ITO which has been mainly used as the positive electrode in the prior art.

The above-prepared device showed an excellent light transmission of about 80% at a visible light region of 5,500 Å but an electric conductivity of about 20 Ω/□. In addition, when the device was operated at 5 V and 1.1 A, light was emitted only around the connection part between a direct current power source and the positive electrode formed on the glass substrate, and at a region which is more than 2 cm apart from the connection part, there was little or no emission of light.

INDUSTRIAL APPLICABILITY

As described above, the electrode according to the present invention can be used as an electrode for organic light-emitting devices. Particularly, the electrode of the present invention can be used as an electrode for large-area organic light-emitting devices which are used in illumination devices, etc.

The invention claimed is:

1. An electrode assembly comprising:
    an electrode having both an upper surface and a lower surface;
    electrode pads placed on both surfaces of the electrode; and
    a plurality of metal lines,
    wherein the metal lines are made of a metal with the same or superior electric conductivity to an electric conductivity of a material for the electrode, and the metal lines are arranged linearly on both surfaces of the electrode on which the electrode pads are placed, in a direction away from a connection part between the electrode and the electrode pad.

2. The electrode assembly of claim 1, wherein the width of the linearly arranged metal lines is 50–1,000 μm, and an interval between the linearly arranged metal lines is 200–10,000 μm.

3. The electrode assembly of claim 1, wherein the thickness of the linearly arranged metal lines is 0.1–5 μm.

4. The electrode assembly of claim 1, wherein the metal with the same or superior electric conductivity to the electric conductivity of the electrode material is selected from the group consisting of aluminum, silver, gold, copper, indium, tin, zinc, palladium, nickel, chromium, titanium, molybdenum, platinum and an alloy thereof.

5. An organic light-emitting device comprising a structure in which a first electrode, organic layers including an organic light-emitting layer, and a second electrode, are sequentially stacked,
    wherein at least one of the first and second electrodes has a structure of an electrode assembly comprising:
    an electrode;
    an electrode pad placed on a surface of the electrode; and
    a plurality of metal lines,
    wherein the metal lines are made of a metal with the same or superior electric conductivity to an electric conductivity of the electrode, and the metal lines are arranged linearly on the surface of the electrode on which the electrode pad is placed, in a direction away from a connection part between the electrode and the electrode pad, and
    wherein the electrode of the electrode assembly structure has a multilayer structure, and different electrically conductive metal compounds are alternatively stacked in the multilayer structure.

6. The organic light-emitting device of claim 5, wherein the metal lines are placed between the electrode of the electrode assembly structure and the organic layers.

7. The organic light-emitting device of claim 5, wherein the width of the linearly arranged metal lines is 50–1,000 μm, and an interval between the linearly arranged metal lines is 200–10,000 μm.

8. The organic light-emitting device of claim 5, wherein the thickness of the linearly arranged metal lines is 0.1–5 μm.

9. The organic light-emitting device of claim 5, wherein the metal with the same or superior electric conductivity to the electric conductivity of a material for the electrode is selected from the group consisting of aluminum, silver, gold, copper, indium, tin, zinc, palladium, nickel, chromium, titanium, molybdenum, platinum and an alloy thereof.

10. The organic light-emitting device of claim 5, wherein the electrode pad is placed on an upper surface of the electrode of the electrode assembly structure, and the metal lines are linearly arranged on the upper surface of the electrode of the electrode assembly structure.

11. The organic light-emitting device of claim 5, wherein the electrode pad is placed on a lower surface of the electrode of the electrode assembly structure, and the metal lines are linearly arranged on the lower surface of the electrode of the electrode assembly structure.

12. The organic light-emitting device of claim 5, wherein the electrode pad is placed on both surfaces of the electrode of the electrode assembly structure, and the metal lines are linearly arranged on the both surfaces of the electrode of the electrode assembly structure.

13. The organic light-emitting device of claim 5, wherein the different electrically conductive metal compounds comprises aluminum, silver, gold, copper, indium, tin, zinc, palladium, nickel, chromium, titanium, molybdenum, erplatinum, or metal oxides thereof.

14. An organic light-emitting device comprising a structure in which a first electrode, organic layers including an organic light-emitting layer, and a second electrode, are sequentially stacked,
    wherein at least one of the first and second electrodes has a structure of an electrode assembly comprising:
    an electrode having both an upper surface and a lower surface;

electrode pads placed on both surfaces of the electrode; and a plurality of metal lines, wherein the metal lines are made of a metal with the same or superior electric conductivity to an electric conductivity of the electrode, and the metal lines are arranged linearly on both surfaces of the electrode on which the electrode pads are placed, in a direction away from a connection part between the electrode and the electrode pad.

* * * * *